United States Patent
Wu et al.

(10) Patent No.: US 8,174,044 B2
(45) Date of Patent: May 8, 2012

(54) LIGHT EMITTING DIODE PACKAGE AND METHOD FOR FORMING THE SAME

(76) Inventors: Shang-Yi Wu, Hsinchu (TW); Tsang-Yu Liu, Zhubei (TW)

( * ) Notice: Subject to any disclaimer, the term of this patent is extended or adjusted under 35 U.S.C. 154(b) by 190 days.

(21) Appl. No.: 12/687,497

(22) Filed: Jan. 14, 2010

(65) Prior Publication Data
US 2011/0169042 A1 Jul. 14, 2011

(51) Int. Cl.
*H01L 33/00* (2010.01)
(52) U.S. Cl. ............... 257/99; 257/698; 257/E33.075; 257/E21.499; 438/26
(58) Field of Classification Search ............ 257/99, 257/E33.075, E21.499, 698; 438/26
See application file for complete search history.

(56) References Cited

U.S. PATENT DOCUMENTS

| 2002/0149102 A1* | 10/2002 | Hashemi et al. | 257/706 |
| 2009/0014735 A1* | 1/2009 | Higashi et al. | 257/98 |
| 2009/0273005 A1* | 11/2009 | Lin | 257/99 |
| 2011/0001162 A1* | 1/2011 | Nakayama et al. | 257/99 |

* cited by examiner

*Primary Examiner* — Trung Q Dang
(74) *Attorney, Agent, or Firm* — Liu & Liu

(57) ABSTRACT

A light emitting diode package is provided, which includes a semiconductor substrate having a first surface and a second surface; at least a through-hole passing through the semiconductor substrate; a thermal via formed extending from the second surface toward the first surface of the semiconductor substrate, wherein the thermal via has a first end near the first surface and a second end near the second surface; an insulating layer overlying a sidewall of the through-hole and extending overlying the first surface and the second surface of the semiconductor substrate, wherein the insulating layer further covers at least one of the first end, the second end and a sidewall of the thermal via; a conducting layer overlying the insulating layer in the through-hole and extending to the first surface and the second surface of the semiconductor substrate; and an LED chip disposed overlying the semiconductor substrate.

20 Claims, 9 Drawing Sheets

LIGHT EMITTING DIODE PACKAGE AND METHOD FOR FORMING THE SAME

BACKGROUND OF THE INVENTION

1. Field of the Invention

The present invention relates to a chip package and method for forming the same, and in particular relates to a light emitting diode (LED) package having a thermal via.

2. Description of the Related Art

A chip package not only provides a connection interface for chips packaged therein, but also provides protection for the chips from environmental contaminants.

With increased functionality, during operation of chips, a large amount of heat may be generated, which negatively affects performance of the chip. Specifically, for LED chips, heat generated during operation may seriously reduce the positive characteristics and lifespan of the LED chips.

Accordingly, a chip package having good heat dissipation is desired.

BRIEF SUMMARY OF THE INVENTION

According to an illustrative embodiment, a light emitting diode package is provided. The light emitting diode package comprises a semiconductor substrate having a first surface and a second surface; at least a through-hole passing through the semiconductor substrate; a thermal via formed extending from the second surface toward the first surface of the semiconductor substrate, wherein the thermal via has a first end near the first surface and a second end near the second surface; an insulating layer overlying a sidewall of the through-hole and extending overlying the first surface and the second surface of the semiconductor substrate, wherein the insulating layer further covers at least one of the first end, the second end and a sidewall of the thermal via; a conducting layer overlying the insulating layer in the through-hole and extending to the first surface and the second surface of the semiconductor substrate; and an LED chip disposed overlying the semiconductor substrate.

According to another illustrative embodiment, a method for forming a light emitting diode package is provided. The method for forming a light emitting diode package comprises providing a semiconductor substrate having a first surface and a second surface; forming at least a first hole and at least a second hole from the second surface toward the first surface of the semiconductor substrate, wherein the first hole has a depth deeper than that of the second hole; thinning the semiconductor substrate from the first surface to expose the first hole to form a through-hole, wherein the second hole serves as a heat dissipation hole extending from the second surface toward the first surface of the semiconductor substrate; filling the heat dissipation hole with a thermal conductive material to form a thermal via, wherein the thermal via has a first end near the first surface and a second end near the second surface; forming a first insulating layer overlying a sidewall of the through-hole and extending overlying the first surface and the second surface of the semiconductor substrate, wherein the first insulating layer further covers at least one of the first end, the second end and a sidewall of the thermal via; forming a conducting layer overlying the first insulating layer in the through-hole and extending to the first surface and the second surface of the semiconductor substrate; and disposing an LED chip overlying the first surface or the second surface of the semiconductor substrate, wherein the LED chip has an electrode electrically connected to the conducting layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many difference embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer include embodiments where the first and second layers are in direct contact and those where one or more layers are interposing the first and second layers.

Figure 1A:
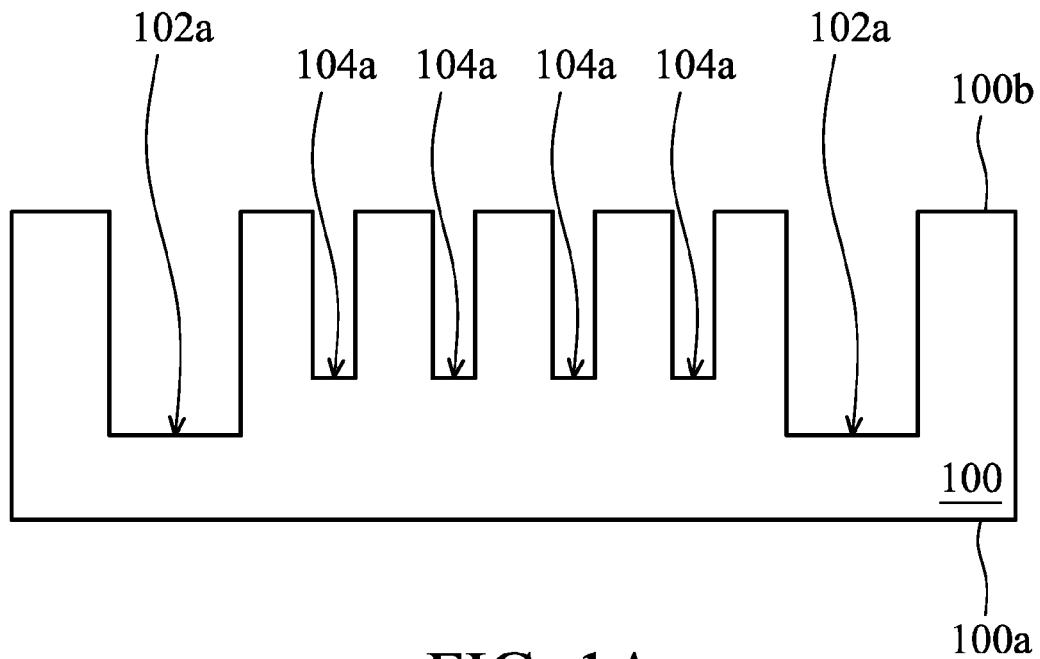
FIGS. 1A-1H are cross-sectional views showing the steps of forming a chip package according to an embodiment of the present invention.

FIGS. 1A-1H are cross-sectional views showing the steps of forming a chip package according to an embodiment of the present invention. Referring to FIG. 1A, a semiconductor substrate 100 having a first surface 100a and a second surface 100b is provided. The semiconductor substrate 100 may comprise a semiconductor material, such as silicon. In one embodiment, the semiconductor substrate 100 is preferably a silicon wafer which is suitable for wafer-level packaging.

Then, the semiconductor substrate 100 is partially removed to form at least a through-hole and at least a heat dissipation hole. As shown in FIG. 1A, at least a hole 102a and at least a heat dissipation hole 104a is formed by partially removing the semiconductor substrate 100 from the second surface 100b toward the first surface 100a. In this embodiment, a plurality of holes 102a and a plurality of heat dissipation holes 104a are formed simultaneously. For example, a photolithography and etching process may be performed to form the holes 102a and the heat dissipation holes 104a. In another embodiment, the holes 102a and the heat dissipation holes 104a are formed separately. The hole 102a may have a size larger than that of the heat dissipation hole 104a and have a depth deeper than that of the heat dissipation hole 104a. For example, when the hole 102a and the heat dissipation hole 104a both have circle openings, the opening of the hole 102a has a diameter larger than that of the heat dissipation hole 104a.

Figure 1B:
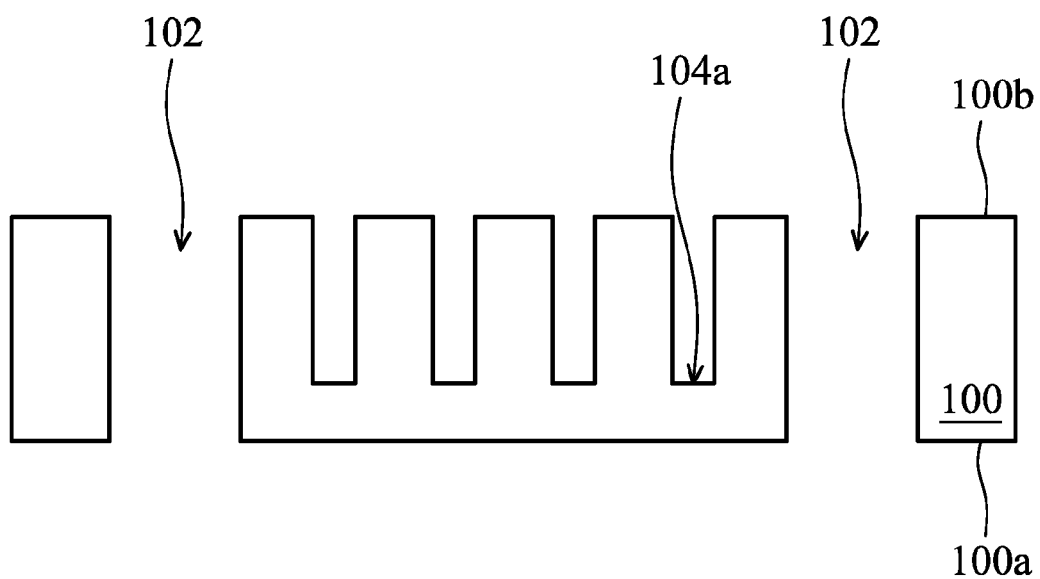

Referring to FIG. 1B, the semiconductor substrate 100 is then thinned from the first surface 100a to expose the hole 102a to form a through-hole 102. For example, a grinding or a chemical mechanical polishing process may be performed on the first surface 100a of the semiconductor substrate 100 until the bottom portion of the hole 102a is reached or exposed. The semiconductor substrate 100 may be thinned to a predetermined thickness depending on the requirement.

As shown in FIG. 1B, at least a through-hole 102 penetrating the first surface 100a and the second surface 100b of the semiconductor substrate 100 and at least a heat dissipation hole 104a extending from the second surface 100b toward the first surface 100a are formed through partially removing and thinning the semiconductor substrate 100. In this embodiment, a plurality of through-holes 102 and a plurality of heat dissipation holes 104a are formed. In another embodiment, the through-hole 102 may be formed during a single etching process, without the thinning process of the substrate. In this case, the through-hole 102 and the heat dissipation hole 104a may be defined during different patterning processes. However, in another embodiment, the through-hole 102 and the heat dissipation hole 104a may be formed during a same etching process, wherein the through-hole 102 may have a size larger than that of the heat dissipation hole 104a. It should be noted that a shape of the opening of the through-hole 102 or the heat dissipation hole 104a may comprise any suitable shape, such as a circle, rectangle, square, and so on.

Figure 1C:
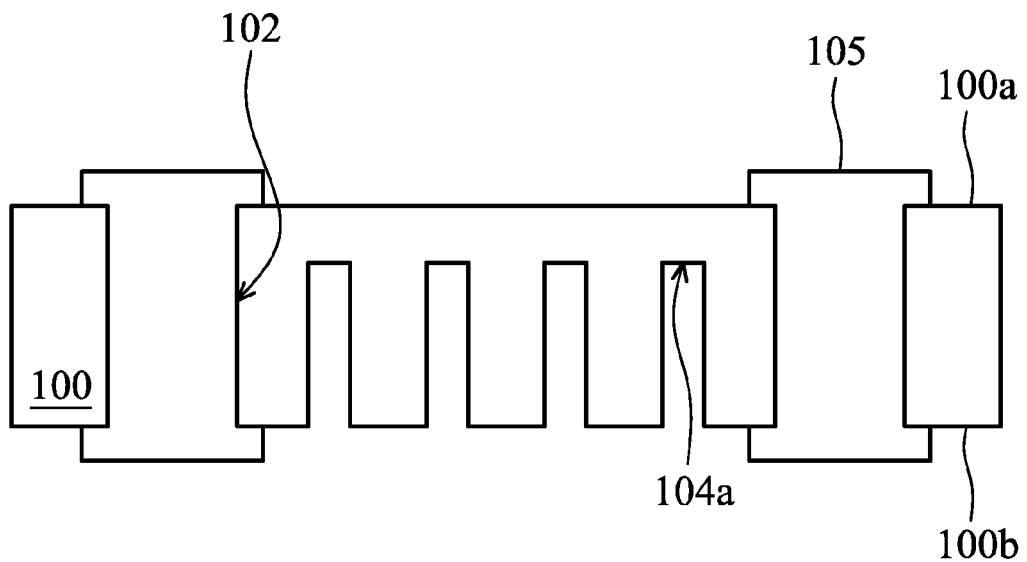

Referring to FIG. 1C, the heat dissipation holes 104a will be filled with a thermal conductive material to form a plurality of thermal vias. In this embodiment, the thermal conductive material and a subsequently formed conducting layer, which will be formed in the through-hole 102, are separately formed. Thus, before the forming of the thermal vias, at least a blocking structure 105 may be formed to cover the through-hole 102. In this embodiment, the blocking structure 105 may partially or completely fill the through-hole 102. The blocking material may include, but is not limited to, a patterned photoresist layer or the like.

Figure 1D:
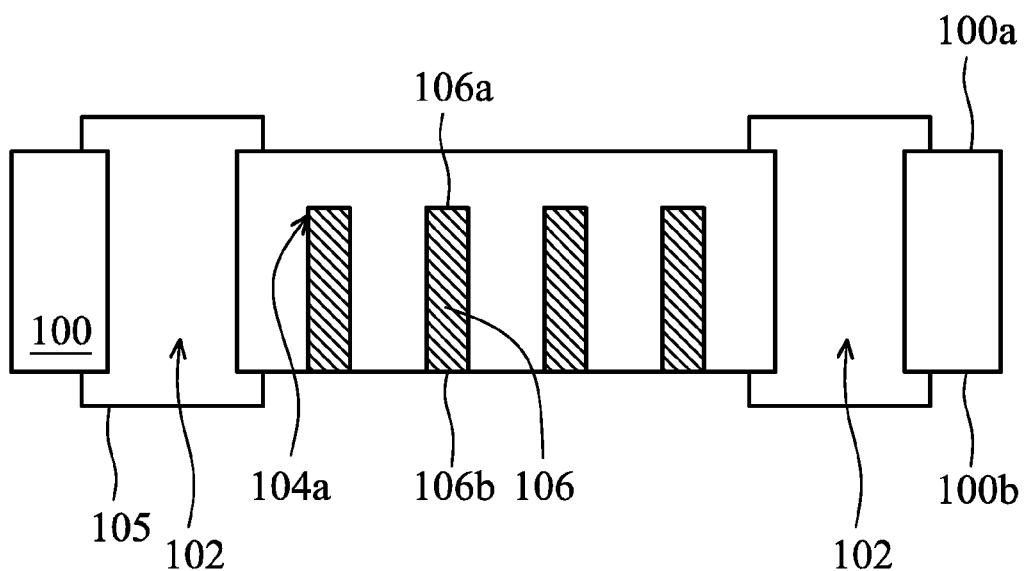

Referring to FIG. 1D, the heat dissipation holes 104a are then filled with a thermal conductive material to form a plurality of thermal vias 106. The thermal via 106 has a first end 106a near the first surface 100a and a second end 106b near the second surface 100b. The thermal conductive material is used to dissipate heat generated during the operation of a chip to be packaged in the electronic package. The thermal conductive material may include any kind of material capable of dissipating heat, such as copper, silver, gold, aluminum, diamond, carbon nanomaterial including carbon nanotube/nanorod, or combinations thereof.

In one embodiment, it is preferable to fill the heat dissipation holes 104a with a metal material, such as copper. For example, an electroplating process is performed to fill the heat dissipation holes 104 with, for example a copper or copper alloy. In some embodiment, a seed layer, adhesion layer, or/and barrier layer may be formed before the electroplating process. In some cases, the filled thermal via 106 may have a protrusion apart from the second surface 100b at the second end 106b due to an overplating process of the thermal conductive material. In this situation, the second end 106b of the thermal via 106 may be planarized by a grinding process, such as a mechanical grinding or a chemical mechanical polishing process.

Although the thermal conductive material shown in FIG. 1D completely fills the heat dissipation hole 104a, the embodiment of the invention is not limited to the specific example mentioned above. In another embodiment, the thermal conductive material may partially fill the heat dissipation hole 104a. For example, the thermal conductive material may be formed only on the sidewall of the heat dissipation hole 104a and not fill the heat dissipation hole 104a completely, thus forming a thermal via 106 having a hollow structure.

Figure 1E:
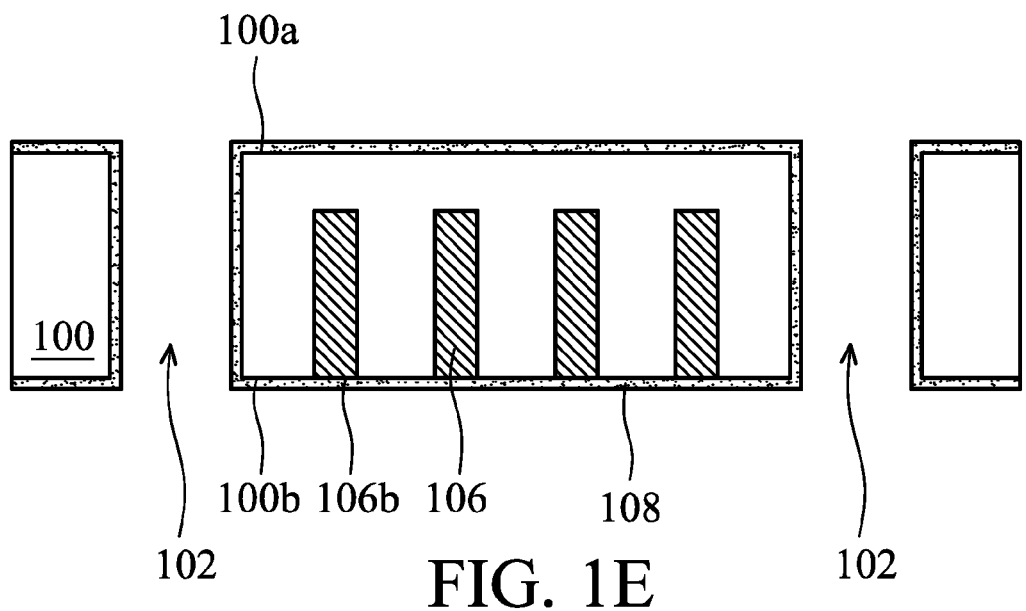

Referring to FIG. 1E, the blocking structure 105 is removed and an insulating layer 108 is formed overlying a sidewall of the through-hole 102 after the thermal vias 106 are formed. Preferably, the insulating layer 108 is formed at a temperature lower than the melting point of the thermal conductive material to maintain the structural stability of the thermal via 106. For example, the insulating layer 108 may be formed by a chemical vapor deposition process. The insulating layer 108 may include, but is not limited to, silicon oxide, silicon nitride, silicon oxynitride, or combinations thereof. In the embodiment shown in FIG. 1E, the insulating layer 108 further extends overlying the first surface 100a and the second surface 100b of the semiconductor substrate 100. The insulating layer 108 is conformally formed overlying the entire surface of the semiconductor substrate 100 and completely covers the second end 106b of the thermal via 106. In one embodiment, the insulating layer 108 directly contacts with the second end 106b of the thermal via 106. Although the insulating layer 108 shown in FIG. 1E covers the entire surface of the semiconductor substrate 100, the insulating layer 108 may be patterned to expose a portion of the semiconductor substrate 100 in another embodiment. In yet another embodiment, an additional patterning process may be performed to partially remove the insulating layer 108 to expose the second end 106b of the thermal via 106. In addition, in one embodiment, the insulating layer 108 overlying the second surface 100b of the semiconductor substrate 100 is a single layer.

Figure 1F:
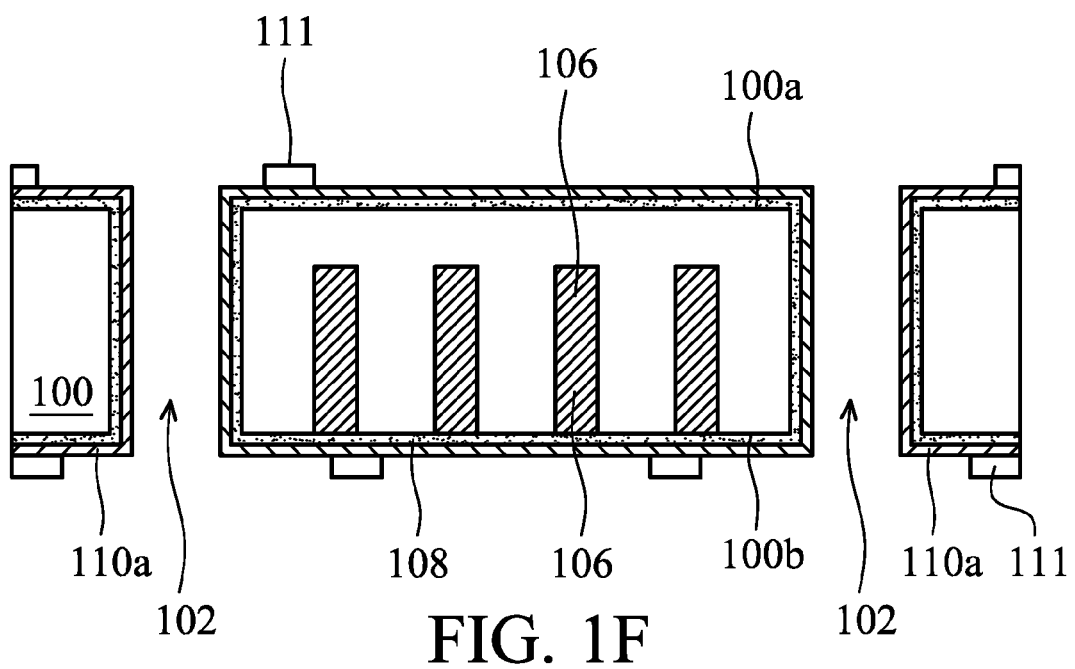

Referring to FIG. 1F, a conducting layer is then formed overlying the insulating layer in the through-hole, wherein the conducting layer is electrically isolated from the thermal via. Referring to FIG. 1F, to form the conducting layer, a seed layer 110a may first be formed overlying the insulating layer 108 in the through-hole 102. The seed layer 110a may include any conductive material, such as copper. The seed layer 110a may be formed by a physical vapor deposition process. In the embodiment shown in FIG. 1F, the seed layer 110a further extends overlying the first surface 100a and the second surface 100b of the semiconductor substrate 100. The seed layer 110a is used to conduct electrical current in a subsequent electroplating process. As shown in FIG. 1F, a covering layer 111 may be formed on portions of the seed layer 110a to prevent metal material to be deposited on covered portions of the seed layer 110a in subsequent electroplating processes. In other embodiments, the conducting layer may be formed by a deposition method other than an electroplating process. Thus, the seed layer may be omitted.

Figure 1G:
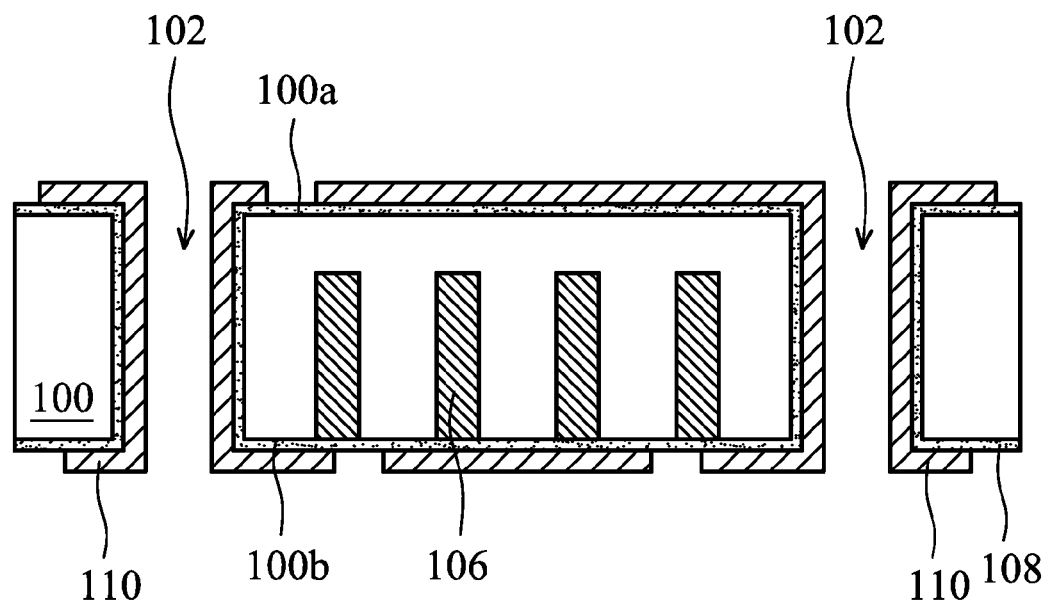

Referring to FIG. 1G, an electroplating process is performed to deposit conductive material on the seed layer 110a to form a conducting layer 110. The conducting layer 110 is formed overlying the insulating layer 108 in the through-hole 102. In the embodiment shown in FIG. 1G, the conducting layer 110 further extends overlying the first surface 100a and the second surface 100b of the semiconductor substrate 100. For example, the conducting layer 110 may further extends under the thermal via 106. Because the covering layer 111 covers portions of the seed layer 110a, the conductive material is not deposited onto the covered portions. Then, the covering layer 111 may be removed. An etching process may be performed to remove the seed layer 110a previously covered by the covering layer 111, thus patterning the conducting layer 110. In this embodiment, the conducting layer 110 is electrically isolated from the thermal conductive material filled in the thermal vias 106 by way of the insulating layer 108.

In another embodiment, the seed layer 110a may be patterned first to expose portions of the insulating layer 108 and the covering layer 111 is later formed on the exposed portions of the insulating layer 108. After the conducting layer 110 is electroplated, the covering layer 111 is removed, thus patterning the conducting layer 110.

The conducting layer 110 and the seed layer 110a may include the same material, such as copper. In another embodiment, the conducting layer 110 and the seed layer 110a may include different materials. It should be appreciated that the conducting layer 110 is not limited to be formed by an electroplating process. In another embodiment, the conducting layer 110 may be conformally formed overlying the insulating layer 108 by another process, such as a chemical vapor deposition, physical vapor deposition, or electroless plating process.

Figure 1H:
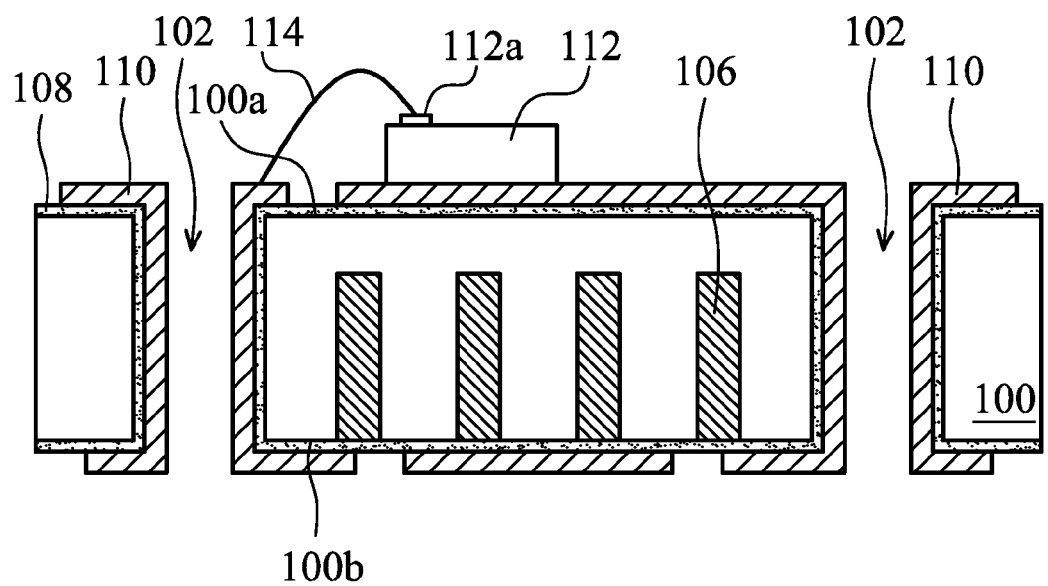

After the conducting layer is formed, a chip is disposed overlying the first surface 100a or the second surface 100b of the semiconductor substrate 100. For example, as shown in FIG. 1H, a chip 112 is disposed on the first surface 100a of the semiconductor substrate 100. The chip 112 has at least an electrode 112a. The electrode 112a is electrically connected to the conducting layer 110. In the embodiment shown in FIG. 1H, the electrode 112a of the chip 112 and the conducting layer 110 are electrically connected together by a bonding wire 114. In another embodiment, the electrode 112a of the chip 112 and the conducting layer 110 may be electrically connected together by other conducting elements, such as a redistribution layer.

The chip 112 may include, but is not limited to, a light emitting diode chip. When the chip 112 is an LED chip, it may generate a large amount of heat during operation. Due to the formation of the thermal via, heat dissipation is achieved. Positive characteristics of the LED chip are not deteriorated and lifespan of the LED device is improved. In addition, it should be understood by one skilled in the art that many conventional elements may be formed in the chip package. For example, a protecting layer may be formed to protect the chip from being damaged.

Figure 2A:
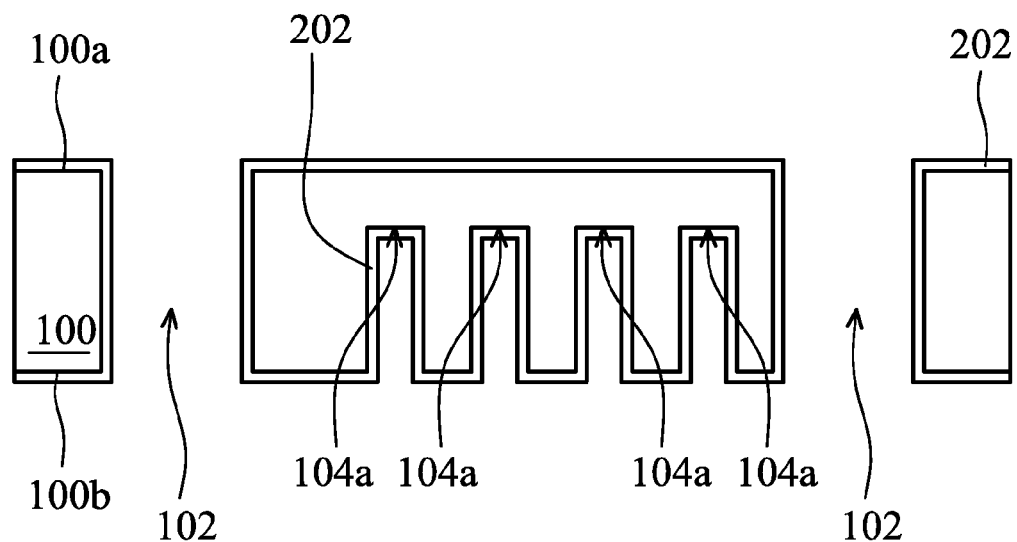
FIGS. 2A-2C are cross-sectional views showing the steps of forming a chip package according to an embodiment of the present invention.
Figure 2B:
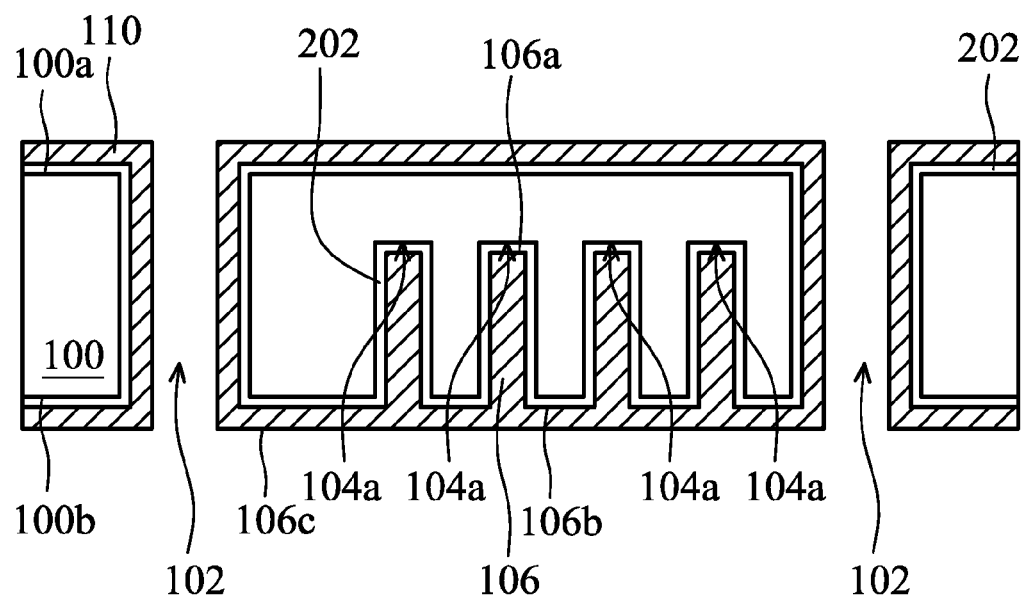
Figure 2C:
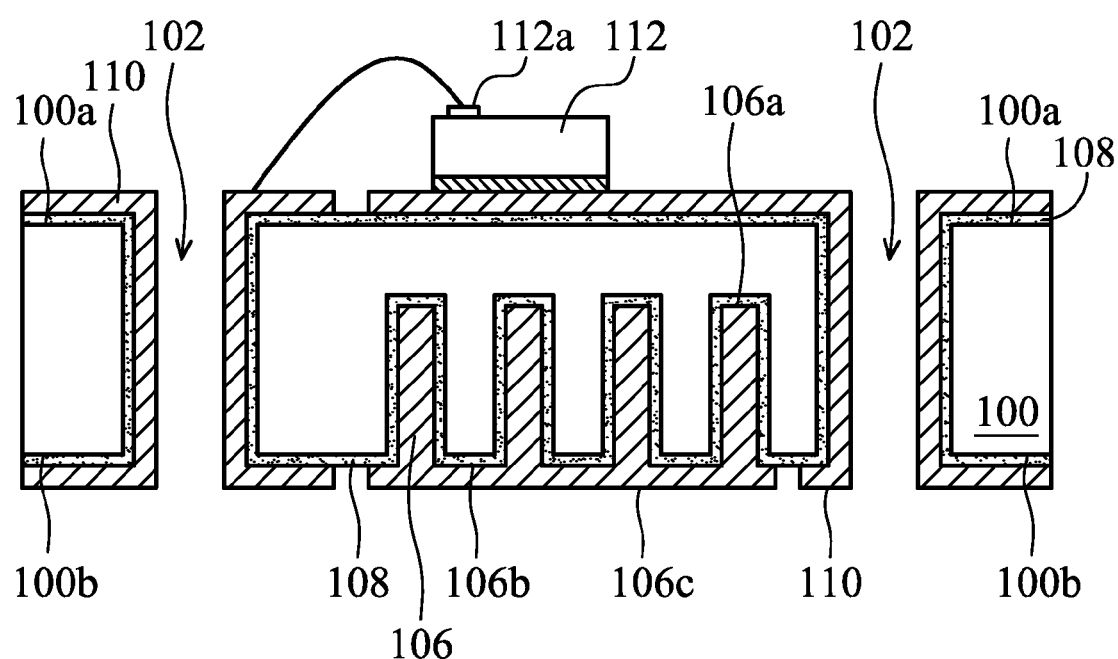

FIGS. 2A-2C are cross-sectional views showing the steps of forming a chip package according to an embodiment of the present invention, wherein similar or same reference numbers are used to designate similar or same elements. In this embodiment, an additional insulating layer is formed between a heat dissipation hole and a thermal via.

Referring to FIG. 2A, a semiconductor substrate 100 having a first surface 100a and a second surface 100b is provided. At least a through-hole 102 and at least a heat dissipation hole 104a are formed in the semiconductor substrate 100. The through-hole 102 and the heat dissipation hole 104a may be formed by a similar method as mentioned in the embodiment shown in FIGS. 1A-1H.

After the heat dissipation hole 104a is defined, an insulating layer is formed overlying a sidewall of the heat dissipation hole 104a. As shown in FIG. 2A, an insulating layer 202 is formed overlying the sidewall of the heat dissipation hole 104a. In this embodiment, the insulating layer 202 further extends into the through-hole 102, overlying the first surface 100a and the second surface 100b of the semiconductor substrate 100. The insulating layer 202 may prevent the semiconductor substrate 100 from being contaminated by a subsequently formed thermal via. In one embodiment, the insulating layer 202 may be formed by a thermal oxidation process. In another embodiment, the insulating layer 202 may be formed by a chemical vapor deposition process. The insulating layer 202 may include, for example silicon oxide.

Referring to FIG. 2B, a thermal via is then formed by a method similar to the embodiment shown in FIG. 1D. For example, an electroplating process is performed to fill the heat dissipation hole 104a with a thermal conductive material to form at least a thermal via 106. In this embodiment, the thermal conductive material is also an electrical conductive material, such as copper. In this embodiment, a conducting layer is formed overlying the sidewall of the through-hole 102 and filled into the heat dissipation hole 104a. The thermal via 106 has a first end 106a near the first surface 100a and a second end 106b near the second surface 100b. The conducting layer covers the entire second surface 100b of the semiconductor substrate 100 and has a lower surface 106c.

Referring to FIG. 2C, the conducting layer is then patterned and thus a portion 110 of the conducting layer extending into the through-hole 102 is electrically insulated from another portion 106c of the conducting layer extending overlying the second ends 106b of the thermal vias 106. In this embodiment, the thermal vias 106 are further linked by the portion 106c of the conducting layer thereunder, further improving heat dissipation of the package. In other words, the thermal conductive material (a portion of the conducting layer) extends overlying the second surface 100b of the semiconductor substrate 100 to link a plurality of thermal vias.

Then, a chip 112 such as an LED chip is disposed on the first surface 100a or the second surface 100b of the semiconductor substrate 100, as shown in FIG. 2C. The chip 112 has at least a electrode 112a electrically connected to the conducting layer extending overlying the sidewall of the through-hole 102.

In the embodiments mentioned above, the heat dissipation hole and the thermal via only partially penetrate the semiconductor substrate. However, the embodiment of the invention is not limited to the specific examples described above. In another embodiment, the heat dissipation hole and the thermal via may completely penetrate the semiconductor substrate.

FIGS. 3A-3E are cross-sectional views showing the chip packages according to embodiments of the present invention, wherein similar or same reference numbers are used to designate similar or same elements.

Figure 3A:
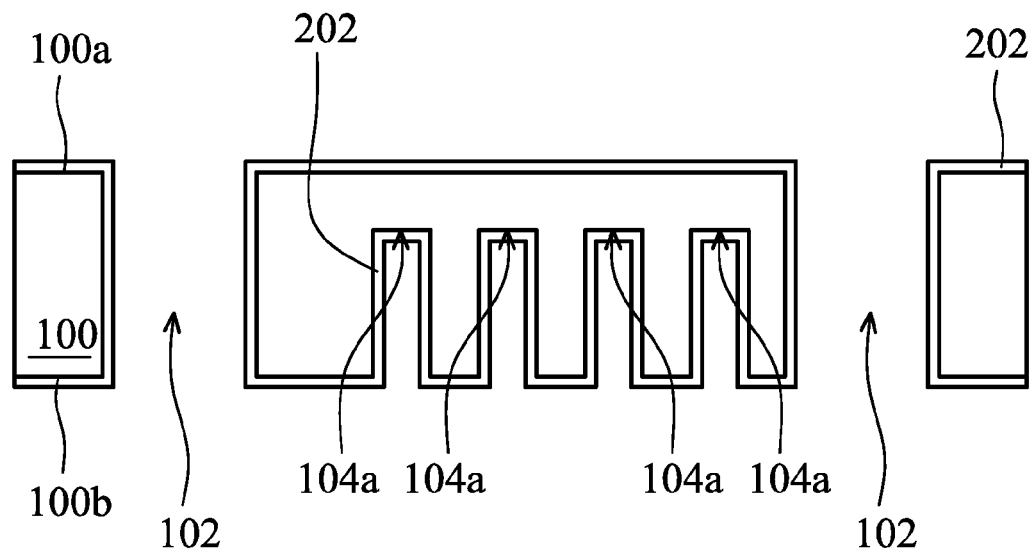
FIGS. 3A-3E are cross-sectional views showing the chip packages according to embodiments of the present invention.

Referring to FIG. 3A, a semiconductor substrate 100 having a first surface 100a and a second surface 100b is provided. At least a through-hole 102 and at least a heat dissipation hole 104a are formed in the semiconductor substrate 100. The through-hole 102 and the heat dissipation hole 104a may be formed by a similar method as mentioned in the embodiment shown in FIGS. 1A-1H.

After the heat dissipation hole 104a is defined, an insulating layer is formed overlying a sidewall of the heat dissipation hole 104a. As shown in FIG. 3A, an insulating layer 202 is formed overlying the sidewall of the heat dissipation hole 104a. In this embodiment, the insulating layer 202 further extends into the through-hole 102, overlying the first surface 100a and the second surface 100b of the semiconductor substrate 100. The insulating layer 202 may prevent the semiconductor substrate 100 from being contaminated by a subsequently formed thermal via. The material and fabrication method of the insulating layer 202 may be similar to the insulating layer described in the embodiment shown in FIG. 2A.

Figure 3B:
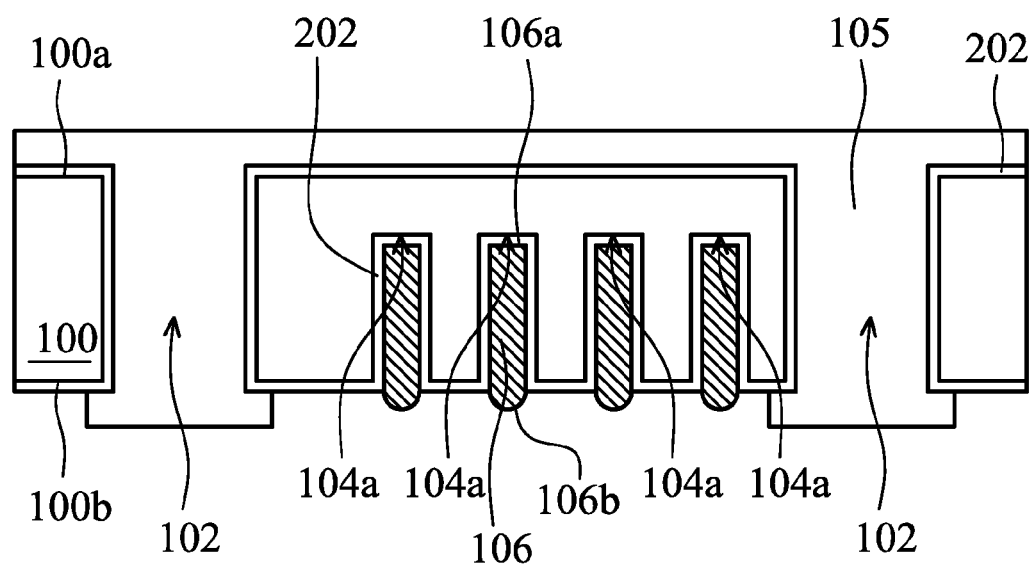

Referring to FIG. 3B, a blocking structure 105 is formed to cover the through-hole 102. In this embodiment, the blocking structure 105 covers the first surface 100a of the substrate 100 and completely fills the through-hole 102. The blocking material may include, but is not limited to, a patterned photoresist layer or the like. For example, a patterned dry film is used as the blocking structure 105.

As shown in FIG. 3B, a thermal via is then formed by a method similar to the embodiment shown in FIG. 1D. For example, an electroplating process is performed to fill the heat dissipation hole 104a with a thermal conductive material to form at least a thermal via 106. The thermal via 106 has a first end 106a near the first surface 100a and a second end 106b near the second surface 100b. In this embodiment, the second end 106b of the thermal via 106 has a protrusion apart from the second surface 100b.

Figure 3C:
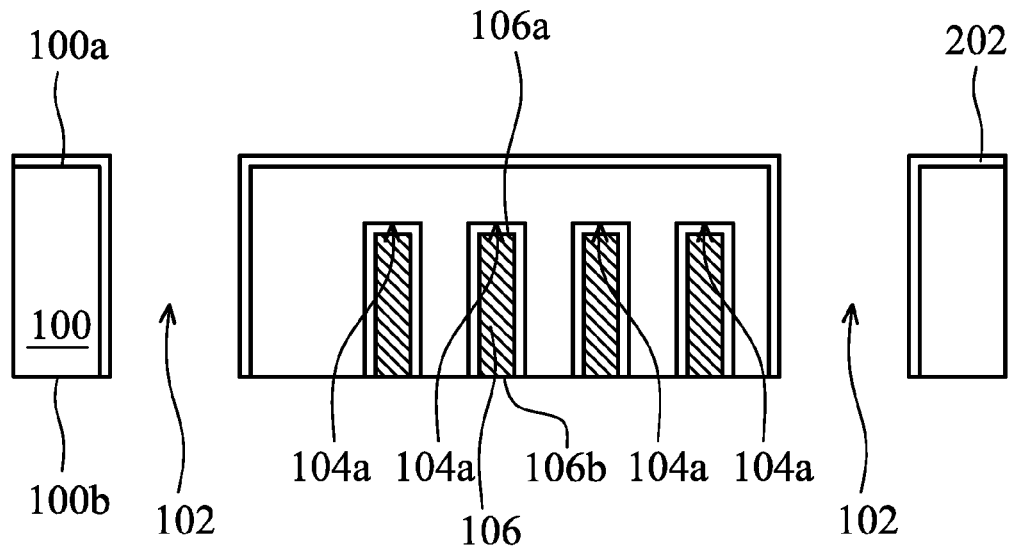

Referring to FIG. 3C, the blocking structure 105 is removed and a grinding process is performed on the second end 106b of the thermal via 106. After the grinding process, the protrusion at the second end 106b of the thermal via 106 and the insulating layer 202 overlying the second surface 100b of the semiconductor substrate 100 are removed. As shown in FIG. 3C, the second end 106b of the thermal via 106 is substantially coplanar with the second surface 100b of the semiconductor substrate 100 since the insulating layer 202 overlying the second surface 100b is also removed during the grinding process of the thermal via 106.

Similar to the embodiment shown in FIGS. 1F-1G, a patterned conducting layer may be subsequently formed overlying the sidewall of the though-hole 102 to form an electrical via. However, the patterned conducting layer usually further extends overlying the first surface 100a and the second surface 100b of the semiconductor substrate 100. Thus, to prevent a short path, an insulating layer should be formed overlying the first surface 100a and the second surface 100b of the semiconductor substrate 100 before the formation of the conducting layer. Specifically, an insulating layer should be formed since the insulating layer 202 may be completely or partially removed during the grinding process of the thermal via 106.

Figure 3D:
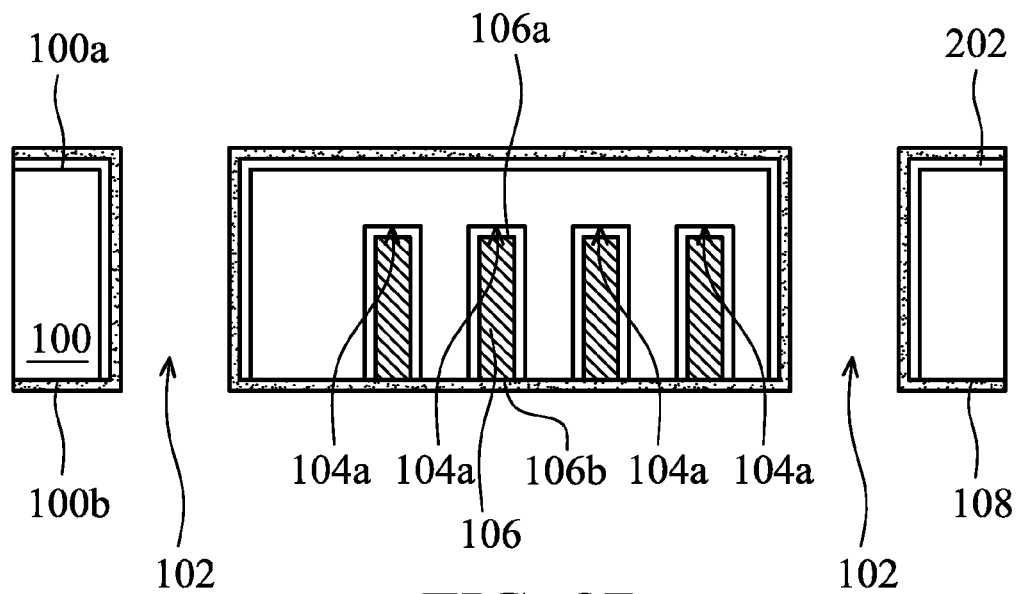

Referring to FIG. 3D, an insulating layer 108 (or a further insulating layer) may be conformally formed overlying the entire surface of the semiconductor substrate 100 by a method similar to the embodiment shown in FIG. 1E. Preferably, the insulating layer 108 is formed by a chemical vapor deposition process. The insulating layer 108 covers the first surface 100a and second surface 100b, thus electrically isolating the semiconductor substrate 100 from a subsequently formed conducting layer. In this embodiment, the insulating layer 108 completely covers the second end 106b of the thermal via 106. However, in another embodiment, an additional patterning process may be performed to partially remove the insulating layer 108 to expose the thermal via 106. In one embodiment, the insulating layer overlying the through-hole 102 and the first surface 100a of the semiconductor substrate 100 comprises a plurality of insulating layers. For example, in the embodiment shown in FIG. 3D, the insulating layer overlying the through-hole 102 and the first surface 100a of the semiconductor substrate 100 comprises the insulating layers 202 and 108.

Figure 3E:
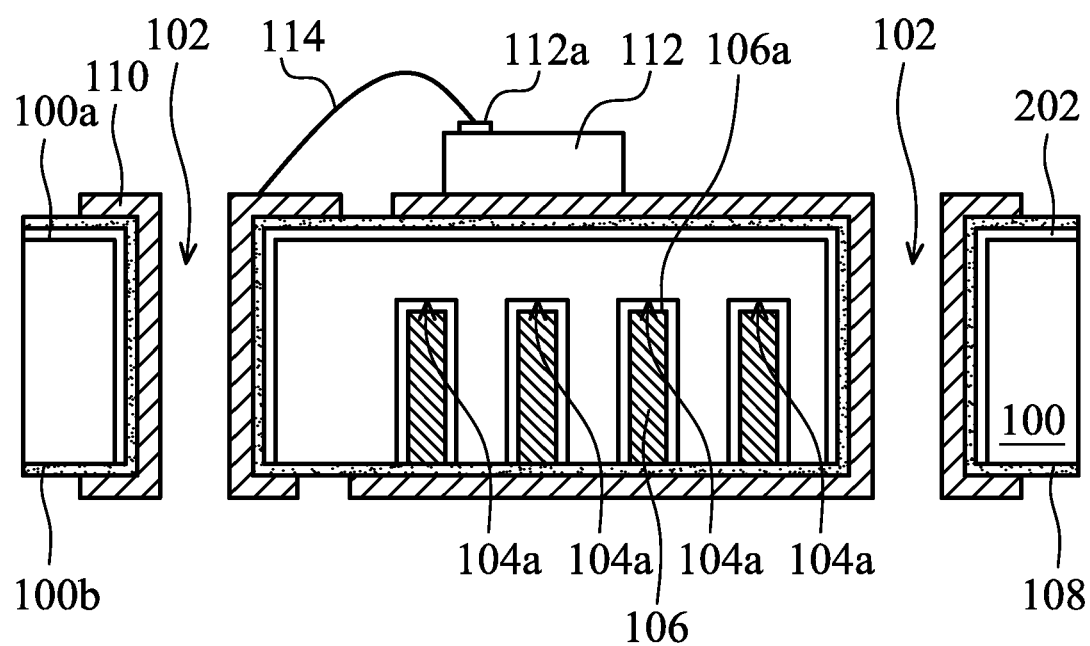

After the formation of the insulating layer 108, a series of processes similar to those shown in FIGS. 1F-1H may be performed to form a patterned conducting layer 110 and to dispose a chip 112 on the first surface 100a or the second surface 100b of the semiconductor substrate 100, as shown in FIG. 3E. In this embodiment, the conducting layer 110 is formed overlying the insulating layers 202 and 108 simultaneously. An electrode 112a of the chip 112 is electrically connected to the conducting layer 110 extending into the through-hole 102. In another embodiment, the insulating layer 108 may be partially removed to define an opening exposing all or portions of the second ends 106b of the thermal vias 106. In yet another embodiment, a thermal conductive layer may further be formed overlying the exposed thermal vias 106.

The invention is not limited to the disclosed embodiments. For example, although the discussed conducting layer formed in the through-hole is a conformal layer, the conducting layer may be formed as other forms. For example, the conducting layer may completely fill the through-hole, similar to the structure of the thermal via.

Due to the formation of the thermal vias, the heat dissipation of the chip package according to an embodiment of the present invention may be improved. Specifically, when the packaged chip is an LED chip, positive characteristics of the LED device are not deteriorated and lifespan of the LED device is improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode package, comprising:
a semiconductor substrate having a first surface and a second surface;
at least a through-hole penetrating the first surface and the second surface of the semiconductor substrate;
at least a heat dissipation hole extending partially through the semiconductor substrate from the second surface toward the first surface of the semiconductor substrate without penetrating the first surface;
a thermal conductive material filled in the heat dissipation hole, forming a thermal via, wherein the thermal via has a first end near the first surface and a second end near the second surface;
an insulating layer overlying a sidewall of the through-hole and extending overlying the first surface and the second surface of the semiconductor substrate, wherein the insulating layer further covers at least one of the first end, the second end and a sidewall of the thermal via;
a conducting layer overlying the insulating layer in the through-hole and extending to the first surface and the second surface of the semiconductor substrate; and
an LED chip disposed overlying the first surface or the second surface of the semiconductor substrate and having an electrode electrically connected to the conducting layer.

2. The light emitting diode package as claimed in claim 1, wherein the through-hole has a size larger than that of the heat dissipation hole.

3. The light emitting diode package as claimed in claim 1, wherein the thermal conductive material completely fills the heat dissipation hole.

4. The light emitting diode package as claimed in claim 1, wherein the thermal conductive material extends overlying the second surface of the semiconductor substrate to link a plurality of thermal vias.

5. The light emitting diode package as claimed in claim 4, wherein the thermal conductive material is a portion of the conducting layer.

6. The light emitting diode package as claimed in claim 1, wherein the thermal conductive material and the conducting layer are separately formed.

7. The light emitting diode package as claimed in claim 6, wherein the thermal conductive material is electrically isolated from the conducting layer by way of the insulating layer.

8. A light emitting diode package, comprising:
- a semiconductor substrate having a first surface and a second surface;
- at least a through-hole penetrating the first surface and the second surface of the semiconductor substrate;
- at least a heat dissipation hole extending from the second surface toward the first surface of the semiconductor substrate;
- a thermal conductive material filled in the heat dissipation hole, forming a thermal via, wherein the thermal via has a first end near the first surface and a second end near the second surface;
- an insulating layer overlying a sidewall of the through-hole and extending overlying the first surface and the second surface of the semiconductor substrate, wherein the insulating layer further covers at least one of the first end, the second end and a sidewall of the thermal via;
- a conducting layer overlying the insulating layer in the through-hole and extending to the first surface and the second surface of the semiconductor substrate, wherein the thermal conductive material is electrically isolated from the conducting layer by way of the insulating layer, and wherein the conducting layer further extends under the thermal via; and
- an LED chip disposed overlying the first surface or the second surface of the semiconductor substrate and having an electrode electrically connected to the conducting layer.

9. The light emitting diode package as claimed in claim 1, wherein the insulating layer overlying the second surface of the semiconductor substrate is a single layer.

10. The light emitting diode package as claimed in claim 1, wherein the insulating layer overlying the through-hole and the first surface of the semiconductor substrate comprises a plurality of layers.

11. A method for forming a light emitting diode package, comprising:
- providing a semiconductor substrate having a first surface and a second surface;
- forming at least a first hole and at least a second hole from the second surface toward the first surface of the semiconductor substrate, wherein the first hole has a depth deeper than that of the second hole;
- thinning the semiconductor substrate from the first surface to expose the first hole to form a through-hole, wherein the second hole serves as a heat dissipation hole extending from the second surface toward the first surface of the semiconductor substrate;
- filling the heat dissipation hole with a thermal conductive material to form a thermal via, wherein the thermal via has a first end near the first surface and a second end near the second surface;
- forming a first insulating layer overlying a sidewall of the through-hole and extending overlying the first surface and the second surface of the semiconductor substrate, wherein the first insulating layer further covers at least one of the first end, the second end and a sidewall of the thermal via;
- forming a conducting layer overlying the first insulating layer in the through-hole and extending to the first surface and the second surface of the semiconductor substrate; and
- disposing an LED chip overlying the first surface or the second surface of the semiconductor substrate, wherein the LED chip has an electrode electrically connected to the conducting layer.

12. The method for forming a light emitting diode package as claimed in claim 11, wherein the step of forming a first insulating layer is performed after filling the heat dissipation hole with a thermal conductive material to form a thermal via such that the first insulating layer further covers the second end of the thermal via.

13. The method for forming a light emitting diode package as claimed in claim 12, wherein the thermal conductive material is electrically isolated from the conducting layer by way of the first insulating layer extending overlying the second surface of the semiconductor substrate.

14. The method for forming a light emitting diode package as claimed in claim 11, wherein the step of forming a first insulating layer is performed before filling the heat dissipation hole with a thermal conductive material to form a thermal via such that the first insulating layer further covers the first end and the sidewall of the thermal via.

15. The method for forming a light emitting diode package as claimed in claim 14, wherein the thermal conductive material and the conducting layer are formed simultaneously.

16. The method for forming a light emitting diode package as claimed in claim 14, further comprising:
- grinding the semiconductor substrate and the first insulating layer from the second surface thereof to expose the second end of the thermal via after performing the steps of forming the first insulating layer and filling the thermal conductive material; and
- forming a further insulating layer overlying the first insulating layer, the second surface of the semiconductor substrate and the second end of the thermal via.

17. The method for forming a light emitting diode package as claimed in claim 16, wherein the conducting layer is formed overlying the first insulating layer and the further insulating layer simultaneously.

18. The method for forming a light emitting diode package as claimed in claim 11, wherein the first hole and the second hole are formed simultaneously.

19. The method for forming a light emitting diode package as claimed in claim 11, wherein the first hole has a size larger than that of the second hole.

20. The method for forming a light emitting diode package as claimed in claim 11, further comprising:
- forming a block structure to cover the through-hole; and
- removing the block structure after the thermal via is formed.

* * * * *